United States Patent
Yokota et al.

(10) Patent No.: US 9,834,703 B2
(45) Date of Patent: Dec. 5, 2017

(54) POLISHING COMPOSITION

(71) Applicant: FUJIMI INCORPORATED, Kiyosu-shi, Aichi (JP)

(72) Inventors: Shuugo Yokota, Kiyosu (JP); Yasuyuki Yamato, Kiyosu (JP); Satoru Yarita, Kiyosu (JP); Tomohiko Akatsuka, Kiyosu (JP)

(73) Assignee: FUJIMI INCORPORATED, Kiyosu-Shi (JP)

( * ) Notice: Subject to any disclaimer, the term of this patent is extended or adjusted under 35 U.S.C. 154(b) by 0 days.

(21) Appl. No.: 14/359,248

(22) PCT Filed: Nov. 21, 2012

(86) PCT No.: PCT/JP2012/080222
§ 371 (c)(1),
(2) Date: May 19, 2014

(87) PCT Pub. No.: WO2013/077372
PCT Pub. Date: May 30, 2013

(65) Prior Publication Data
US 2014/0342561 A1 Nov. 20, 2014

(30) Foreign Application Priority Data

Nov. 25, 2011 (JP) ................................ 2011-258346

(51) Int. Cl.
| | |
|---|---|
| *C09G 1/02* | (2006.01) |
| *B24B 37/04* | (2012.01) |
| *H01L 21/306* | (2006.01) |
| *C09K 3/14* | (2006.01) |
| *H01L 29/20* | (2006.01) |

(52) U.S. Cl.
CPC .............. *C09G 1/02* (2013.01); *B24B 37/044* (2013.01); *C09K 3/1436* (2013.01); *C09K 3/1463* (2013.01); *H01L 21/30625* (2013.01); *H01L 29/20* (2013.01)

(58) Field of Classification Search
CPC combination set(s) only.
See application file for complete search history.

(56) References Cited

U.S. PATENT DOCUMENTS

| | | | |
|---|---|---|---|
| 6,899,821 B2 * | 5/2005 | Uchida | C09G 1/02 252/79.1 |
| 2003/0159362 A1 | 8/2003 | Singh et al. | |
| 2006/0000808 A1 * | 1/2006 | Seki | H01L 21/3212 216/88 |
| 2007/0128872 A1 * | 6/2007 | Itoh | C09G 1/02 438/691 |
| 2007/0200089 A1 * | 8/2007 | Inaba | C09G 1/02 252/79.1 |
| 2008/0032505 A1 | 2/2008 | Kawamura et al. | |
| 2008/0242090 A1 * | 10/2008 | Yamada | C09G 1/02 438/692 |
| 2008/0248727 A1 * | 10/2008 | Shindo | C09G 1/02 451/36 |
| 2009/0087988 A1 | 4/2009 | Saie | |
| 2009/0203215 A1 * | 8/2009 | Yoshikawa et al. | 438/693 |
| 2010/0104806 A1 | 4/2010 | Schwandner | |
| 2011/0180511 A1 * | 7/2011 | Akatsuka | C09G 1/02 216/83 |
| 2012/0295443 A1 | 11/2012 | Morinaga et al. | |

FOREIGN PATENT DOCUMENTS

| | | |
|---|---|---|
| JP | 63-150155 A | 6/1988 |
| JP | 02-156530 A | 6/1990 |
| JP | 2000-208453 A | 7/2000 |
| JP | 2001-044148 A | 2/2001 |
| JP | 2001-068438 A | 3/2001 |
| JP | 2003-220551 A | 8/2003 |
| JP | 2004-327614 A | 11/2004 |
| JP | 2005-518669 A | 6/2005 |
| JP | 2007-012638 A | 1/2007 |
| JP | 2008-041782 A | 2/2008 |
| JP | 2008-066588 A | 3/2008 |
| JP | 2009-144080 A | 7/2009 |
| JP | 2010-109370 A | 5/2010 |
| JP | 2010-153781 A | 7/2010 |
| TW | 200927900 A | 7/2009 |
| WO | WO 2011/093223 A1 | 8/2011 |

\* cited by examiner

*Primary Examiner* — Duy Deo
(74) *Attorney, Agent, or Firm* — Foley & Lardner LLP

(57) ABSTRACT

A polishing composition of the present invention is to be used for polishing an object including a portion containing a group III-V compound material. The polishing composition contains abrasive grains, an oxidizing agent, and a water-soluble polymer. When the polishing composition is left to stand for one day in an environment with a temperature of 25° C., the water-soluble polymer may be adsorbed on the abrasive grains at 5,000 or more molecules per 1 µm² of the surface area of the abrasive grains. Alternatively, the water-soluble polymer may be a compound that reduces the water contact angle of the portion containing a group III-V compound material of the object after being polished with the polishing composition.

7 Claims, No Drawings

POLISHING COMPOSITION

TECHNICAL FIELD

The present invention relates to a polishing composition to be used for polishing an object including a portion containing a group III-V compound material. The present invention also relates to a polishing method and substrate production method using the polishing composition.

BACKGROUND ART

Group III-V compound materials, such as gallium arsenide (GaAs), have higher electron and hole mobility than that of silicon and an excellent carrier transport property, and are expected as next-generation semiconductor channel materials. A group III-V compound channel can be formed by polishing an object including a portion containing a group III-V compound material (hereinafter, also referred to as a group III-V compound material portion) and a portion containing a silicon material (hereinafter, also referred to as a silicon material portion). At this time, in addition to the polishing of the group III-V compound material portion at a high polishing rate, the prevention of the occurrence of a level difference caused by etching is required on a polished surface of the object. However, a polishing composition conventionally used for polishing a group III-V compound semiconductor substrate and described in, for example, Patent Document 1 or 2 is specifically developed for the group III-V compound semiconductor substrate. Therefore, when the polishing composition is used for polishing an object including a group III-V compound material portion and a portion containing a material other than group III-V compounds, the group III-V compound material portion is excessively polished and etched, which makes it difficult to prevent the occurrence of a level difference caused by etching on a polished surface.

PRIOR ART DOCUMENTS

Patent Document 1: Japanese Laid-Open Patent Publication No. 63-150155
Patent Document 2: Japanese Laid-Open Patent Publication No. 2004-327614

SUMMARY OF THE INVENTION

Problems that the Invention is to Solve

Accordingly, it is an objective of the present invention to provide a polishing composition capable of suppressing the occurrence of a level difference caused by etching on a polished surface of an object including a group III-V compound material portion, and a polishing method and substrate production method using the polishing composition.

Means for Solving the Problems

In order to achieve the above-mentioned objective and in accordance with a first aspect of the present invention, provided is a polishing composition to be used for polishing an object including a group III-V compound material portion. The polishing composition contains abrasive grains, an oxidizing agent, and a water-soluble polymer.

When the polishing composition is left to stand for one day in an environment with a temperature of 25° C., the water-soluble polymer may be adsorbed on the abrasive grains at 5,000 or more molecules per 1 $\mu m^2$ of the surface area of the abrasive grains.

Alternatively, the water-soluble polymer may be a compound by which the group III-V compound material portion after the object is polished with the polishing composition has a water contact angle lower than that of the group III-V compound material portion after the object is polished with another composition having the same makeup as the polishing composition except that the water-soluble polymer is not contained therein.

Alternatively, the water-soluble polymer may be an anionic surfactant represented by the chemical formula: R1-X1-Y1. R1 represents an alkyl group, an alkylphenyl group, or an alkenyl group, X1 represents a polyoxyethylene group, a polyoxypropylene group, or a poly(oxyethylene•oxypropylene) group, Y1 represents a $SO_3M1$ group, a $SO_4M1$ group, a $CO_2M1$ group, or a $PO_3M1_2$ group, and M1 represents a counter ion.

In accordance with a second aspect of the present invention, provided is a method for polishing an object including a group III-V compound material portion with the polishing composition of the first aspect.

In accordance with a third aspect of the present invention, provided is a method for producing a substrate by polishing an object including a group III-V compound material portion with the polishing composition of the first aspect.

Effects of the Invention

The present invention succeeds in providing a polishing composition capable of suppressing the occurrence of a level difference caused by etching on a polished surface of an object including a group III-V compound material portion, and a polishing method and substrate production method using the polishing composition.

MODES FOR CARRYING OUT THE INVENTION

One embodiment of the present invention will be described below.

A polishing composition of the present embodiment is prepared by mixing abrasive grains, an oxidizing agent, and a water-soluble polymer with water. Therefore, the polishing composition contains abrasive grains, an oxidizing agent, and a water-soluble polymer.

The polishing composition is used for polishing an object including a group III-V compound material portion, and specifically for polishing the object to produce a substrate. The object to be polished may further include a silicon material portion. Examples of the group III-V compound material include gallium phosphide (GaP), indium phosphide (InP), gallium arsenide (GaAs), indium arsenide (InAs), and indium antimonide (InSb). Examples of the silicon material include polysilicon, silicon oxide, and silicon nitride.

(Abrasive Grains)

The abrasive grains contained in the polishing composition may be any of inorganic particles and organic particles. Specific examples of inorganic particles include particles made of a metal oxide, such as silica, alumina, ceria, and titania. Specific examples of organic particles include polymethyl methacrylate (PMMA) particles. Among them, silica particles are preferable, and colloidal silica is particularly preferable.

The content of the abrasive grains in the polishing composition is preferably 0.01% by mass or more, more preferably 0.05% by mass or more, and still more preferably 0.1% by mass or more. As the abrasive grain content increases, the polishing rate of the group III-V compound material portion with the polishing composition is enhanced.

The content of the abrasive grains in the polishing composition is also preferably 20% by mass or less, more preferably 17% by mass or less, and still more preferably 15% by mass or less. As the abrasive grain content decreases, the material cost of the polishing composition can be reduced, and additionally, the aggregation of the abrasive grains is less likely to occur.

The average primary particle diameter of the abrasive grains is preferably 5 nm or more, more preferably 7 nm or more, and still more preferably 10 nm or more. As the average primary particle diameter of the abrasive grains increases, the polishing rate of the group III-V compound material portion with the polishing composition is enhanced. The value of the average primary particle diameter of the abrasive grains can be calculated, for example, based on the specific surface area of the abrasive grains measured by the BET method.

The average primary particle diameter of the abrasive grains is also preferably 150 nm or less, more preferably 110 nm or less, and still more preferably 100 nm or less. As the average primary particle diameter of the abrasive grains decreases, a polished surface with fewer scratches is easily obtained by polishing the object with the polishing composition.

The average secondary particle diameter of the abrasive grains is preferably 300 nm or less, more preferably 270 nm or less, and still more preferably 250 nm or less. As the average secondary particle diameter of the abrasive grains decreases, a polished surface with fewer scratches is easily obtained by polishing the object with the polishing composition. The value of the average secondary particle diameter of the abrasive grains can be measured, for example, by a laser light scattering method.

(Oxidizing Agent)

Although the type of the oxidizing agent contained in the polishing composition is not particularly limited, the oxidizing agent preferably has a standard electrode potential of 0.3 V or more. When an oxidizing agent having a standard electrode potential of 0.3 V or more is used, the polishing rate of the group III-V compound material portion and silicon material portion with the polishing composition is advantageously enhanced as compared with when an oxidizing agent having a standard electrode potential of less than 0.3 V is used. Specific examples of an oxidizing agent having a standard electrode potential of 0.3 V or more include hydrogen peroxide, sodium peroxide, barium peroxide, an organic oxidizing agent, ozone water, a silver (II) salt, an iron (III) salt, permanganic acid, chromic acid, dichromic acid, peroxodisulfuric acid, peroxophosphoric acid, peroxosulfuric acid, peroxoboric acid, performic acid, peracetic acid, perbenzoic acid, perphthalic acid, hypochlorous acid, hypobromous acid, hypoiodous acid, chloric acid, chlorous acid, perchloric acid, bromic acid, iodic acid, periodic acid, sulfuric acid, persulfuric acid, citric acid, dichloroisocyanuric acid, and salts thereof. Among them, hydrogen peroxide, ammonium persulfate, and sodium dichloroisocyanurate are preferable since the polishing rate of the group III-V compound material portion and silicon material portion with the polishing composition is greatly enhanced.

The standard electrode potential is represented by the following formula when all chemical species participating in an oxidation reaction are in a normal state:

$$E0 = -\Delta G0/nF = (RT/nF)\ln K$$

where E0 is a standard electrode potential, $\Delta G0$ is standard Gibbs energy change of the oxidation reaction, K is an equilibrium constant thereof, F is a Faraday constant, T is an absolute temperature, and n is the number of electrons participating in the oxidation reaction. Therefore, since the standard electrode potential fluctuates with a temperature, a standard electrode potential at 25° C. is utilized in the present specification. The standard electrode potential of an aqueous solution system is described in, for example, Handbook of Chemistry (fundamental part) II, revised 4th edition, pp. 464-468 (edited by the Chemical Society of Japan).

The content of the oxidizing agent in the polishing composition is preferably 0.01 mol/L or more, and more preferably 0.1 mol/L or more. As the oxidizing agent content increases, the polishing rate of the group III-V compound material portion with the polishing composition is enhanced.

The content of the oxidizing agent in the polishing composition is also preferably 100 mol/L or less, and more preferably 50 mol/L or less. As the oxidizing agent content decreases, the material cost of the polishing composition can be reduced, and additionally, the burden of treating the polishing composition after use in polishing, that is, the burden of waste liquid treatment can be reduced.

(Water-soluble Polymer)

The type of the water-soluble polymer contained in the polishing composition is not particularly limited. A water-soluble polymer that is adsorbed on the abrasive grains at 5,000 or more molecules per 1 $\mu m^2$ of the surface area of the abrasive grains when the polishing composition is left to stand for one day in an environment with a temperature of 25° C., such as a nonionic compound having a polyoxy alkylene chain, can be used. Specific examples of a nonionic compound having a polyoxy alkylene chain include polyethylene glycol, polypropylene glycol, polyoxyethylene (hereinafter, referred to as POE) alkylene diglyceryl ether, POE alkyl ether, POE sorbitan fatty acid ester, POE alkyl phenyl ether, POE glycol fatty acid ester, POE hexytane fatty acid ester, POE polypropylene alkyl ether, and a block/random copolymer of polyoxypropylene/polyoxyethylene. When such a water-soluble polymer is used, a required amount or more of the water-soluble polymer is adsorbed on the surface of the abrasive grains, which causes a change in the properties of the abrasive grains. As a result, it is possible to suppress the occurrence of dishing or erosion on the surface of the object to be polished.

Alternatively, a water-soluble polymer having a hydrophilic group, such as a hydroxy group, a carboxy group, an amino group, and an ether group, can also be used. When such a water-soluble polymer is used, the water-soluble polymer in the polishing composition is adsorbed on the surface of the group III-V compound material portion, which has hydrophobicity, and thereby improving the wettability of this surface. As a result, it is possible to suppress the occurrence of a level difference caused by etching on the surface of the object to be polished. The number of the hydrophilic groups contained in the water-soluble polymer is preferably 3 or more per molecule, more preferably 5 or more per molecule, and still more preferably 10 or more per molecule. As the number of the hydrophilic groups contained in the water-soluble polymer is large, a hydrophilic effect on the group III-V compound material portion is enhanced. As a result, it is possible to further suppress the occurrence of a level difference caused by etching.

The water-soluble polymer is preferably selected and used from compounds by which the group III-V compound material portion after the object is polished with the polishing composition has a water contact angle lower than that of the group III-V compound material portion after the same object is polished with another composition having the same makeup as the polishing composition except that the water-soluble polymer is not contained therein. The water contact angle of the group III-V compound material portion after the object is polished with the polishing composition is preferably 57 degrees or less, more preferably 50 degrees or less, and still more preferably 45 degrees or less. Specific examples of the water-soluble polymer include polysaccharides such as alginic acid, pectic acid, carboxymethyl cellulose, starch, agar, curdlan, and pullulan; alcohol compounds such as polyethylene glycol, polyglycerin, pentanol, polypropylene glycol, and polyvinyl alcohol (among them, polyethylene glycol, polyglycerin, and polypropylene glycol are alcohol compounds and polyethers); nonionic compounds having a polyoxy alkylene chain such as POE alkylene diglyceryl ether, POE alkyl ether, and monooleic acid POE(6) sorbitan; and polycarboxylic acids or salts thereof such as polyaspartic acid, polyglutamic acid, polylysine, polymalic acid, polymethacrylic acid, ammonium polymethacrylate, sodium polymethacrylate, polymaleic acid, polyitaconic acid, polyfumaric acid, poly(p-styrenecarboxylic acid), polyacrylic acid, polyacrylamide, aminopolyacrylamide, polymethyl acrylate, polyethyl acrylate, ammonium polyacrylate, sodium polyacrylate, polyamide acid, ammonium polyamidate, sodium polyamidate, polyglyoxylic acid, polycarboxylic acid amide, polycarboxylic acid ester, and polycarboxylic acid salt.

The content of the water-soluble polymer in the polishing composition is preferably 10 ppm by mass or more, more preferably 50 ppm by mass or more, and still more preferably 100 ppm by mass or more. As the water-soluble polymer content increases, the occurrence of a level difference caused by etching is further suppressed.

The content of the water-soluble polymer in the polishing composition is also preferably 100,000 ppm by mass or less, more preferably 50,000 ppm by mass or less, and still more preferably 10,000 ppm by mass or less. As the water-soluble polymer content decreases, the aggregation of the abrasive grains in the polishing composition is less likely to occur. As a result, the preservation stability of the polishing composition is improved.

The molecular weight of the water-soluble polymer is preferably 100 or more, and more preferably 300 or more. As the molecular weight of the water-soluble polymer increases, the occurrence of a level difference caused by etching is further suppressed.

The molecular weight of the water-soluble polymer is also preferably 500,000 or less, and more preferably 300,000 or less. As the molecular weight of the water-soluble polymer decreases, the aggregation of the abrasive grains in the polishing composition is less likely to occur. As a result, the preservation stability of the polishing composition is improved.

Alternatively, the polishing composition of the present embodiment may contain an anionic surfactant represented by the chemical formula: R1-X1-Y1 as the water-soluble polymer. R1 represents an alkyl group, an alkylphenyl group, or an alkenyl group, X1 represents a polyoxyethylene group, a polyoxypropylene group, or a poly(oxyethylene•oxypropylene) group, and Y1 represents a $SO_3M1$ group, a $SO_4M1$ group, a $CO_2M1$ group, or a $PO_3M1_2$ group. M1 of the $SO_3M1$ group, $SO_4M1$ group, $CO_2M1$ group, and $PO_3M1_2$ group represents a counter ion. Examples of the counter ion include, but are not particularly limited to, an ammonium cation, an amine cation, and alkali metal cations, such as a lithium cation, a sodium cation, and a potassium cation. All the counter ions need not to be substituted, and some counter ions may be hydrogen. When the anionic surfactant is used as the water-soluble polymer, the anionic surfactant is electrically adsorbed on the group III-V compound material portion of the object to be polished, to form a protective film. As a result, the affinity between the surface of the group III-V compound material portion and the abrasive grains is reduced, and thus it is possible to suppress the occurrence of dishing on the surface of the object to be polished.

According to the present embodiment, the following advantages are obtained.

In order to suppress the occurrence of a level difference caused by etching on the surface of the object to be polished, the water-soluble polymer, which interacts with the group III-V compound material portion of the object to be polished, is used in the polishing composition of the present embodiment. Therefore, the polishing composition is suitably used for polishing the object including the group III-V compound material portion.

The embodiment described above may be modified as follows.

The polishing composition of the embodiment described above may contain two or more types of abrasive grains.

The polishing composition of the embodiment described above may contain two or more oxidizing agents.

The polishing composition of the embodiment described above may contain two or more water-soluble polymers.

The polishing composition of the embodiment described above may further contain a known additive such as a preservative agent as required.

The polishing composition of the embodiment described above may be of a one-pack type or may be of a multi-pack type, such as a two-pack type.

The polishing composition of the embodiment described above may be prepared by diluting an undiluted solution of the polishing composition with water.

Next, examples of the present invention and comparative examples will be described.

Polishing compositions of Examples 1 to 12 were prepared by mixing colloidal silica, an oxidizing agent, and a water-soluble polymer with water. A polishing composition of Comparative Example 1 was prepared by mixing colloidal silica and an oxidizing agent with water. The details of the components in each of the polishing compositions are shown in Table 1.

TABLE 1

| | Colloidal silica | | | Oxidizing agent | | | Water-soluble polymer | | | |
| --- | --- | --- | --- | --- | --- | --- | --- | --- | --- | --- |
| | Primary particle diameter [nm] | Secondary particle diameter [nm] | Content [% by mass] | Type | Standard electrode potential [V] | Content [mol/L] | Type | Molecular weight | Content [ppm by mass] | Presence or absence of polyoxy alkylene chain |
| Example 1 | 33.3 | 64.3 | 1 | $H_2O_2$ | 1.7 | 0.2 | Pullulan | 200000 | 5000 | Absence |
| Example 2 | 33.3 | 64.3 | 1 | $H_2O_2$ | 1.7 | 0.2 | Polyethylene glycol | 400 | 5000 | Presence |
| Example 3 | 33.3 | 64.3 | 1 | $H_2O_2$ | 1.7 | 0.2 | Polyethylene glycol | 1000 | 5000 | Presence |
| Example 4 | 33.3 | 64.3 | 1 | $H_2O_2$ | 1.7 | 0.2 | Polyglycerin | 310 | 5000 | Absence |
| Example 5 | 33.3 | 64.3 | 1 | $H_2O_2$ | 1.7 | 0.2 | Polyglycerin | 750 | 5000 | Absence |
| Example 6 | 33.3 | 64.3 | 1 | $H_2O_2$ | 1.7 | 0.2 | Pentanol | 88 | 5000 | Absence |
| Example 7 | 33.3 | 64.3 | 1 | $H_2O_2$ | 1.7 | 0.2 | Polypropylene glycol | 400 | 5000 | Presence |
| Example 8 | 33.3 | 64.3 | 1 | $H_2O_2$ | 1.7 | 0.2 | Polypropylene glycol | 1000 | 5000 | Presence |
| Example 9 | 33.3 | 64.3 | 1 | $H_2O_2$ | 1.7 | 0.2 | POE alkylene diglyceryl ether | 400 | 200 | Presence |
| Example 10 | 33.3 | 64.3 | 1 | $H_2O_2$ | 1.7 | 0.2 | POE alkyl ether | 350 | 200 | Presence |
| Example 11 | 33.3 | 64.3 | 1 | $H_2O_2$ | 1.7 | 0.2 | Monooleic acid POE(6) sorbitan | 500 | 200 | Presence |
| Example 12 | 33.3 | 64.3 | 1 | $H_2O_2$ | 1.7 | 0.2 | Polyvinyl alcohol | 22000 | 5000 | Absence |
| Comparative Example 1 | 33.3 | 64.3 | 1 | $H_2O_2$ | 1.7 | 0.2 | — | — | — | — |

The polishing compositions of Examples 1 to 12 were measured in terms of the number of molecules of the water-soluble polymer adsorbed per unit surface area of colloidal silica, as follows. That is, each polishing composition was left to stand for one day in an environment with a temperature of 25° C. and subjected to centrifugal separation at the rotation speed of 20,000 rpm for 2 hours, after which the supernatant liquid was collected. The total amount of organic carbon in the collected supernatant liquid was measured using a combustion catalytic oxidation type organic carbon measurement apparatus. Separately, compositions that had the same makeup as the polishing compositions except that the colloidal silica was not contained therein were prepared and left to stand for one day in an environment with a temperature of 25° C. and, in the same way as described above, the total amount of organic carbon in the composition was measured using a combustion catalytic oxidation type organic carbon measurement apparatus. Then, by subtracting the total amount of organic carbon in the collected supernatant liquid of the corresponding polishing composition from the measured total amount of organic carbon in the composition, the total amount of the water-soluble polymer adsorbed on colloidal silica in the polishing composition was calculated. The number of molecules of the water-soluble polymer adsorbed per unit surface area of colloidal silica was calculated from the thus calculated adsorbed amount based on the surface area of the colloidal silica and the molecular weight of the water-soluble polymer. The results are shown in the column entitled "number of molecules adsorbed per 1 μm² of colloidal silica" of Table 2.

The value of polishing rate obtained when the surface of a gallium arsenide blanket wafer is polished under the conditions shown in Table 3 with each of the polishing compositions of Examples 1 to 12 and Comparative Example 1 is shown in the column entitled "polishing rate of GaAs" of Table 2. The value of the polishing rate was obtained by dividing the difference between the weights of the wafer before and after polishing by the density and polishing time.

The polished gallium arsenide blanket wafers were rinsed with pure water and dried by being blown with dry air, after which the water contact angle was measured by the θ/2 method using a commercially available contact angle evaluation apparatus. The results are shown in the column entitled "water contact angle" of Table 2.

A gallium arsenide blanket wafer was cut into wafer small pieces each having four sides of 2 cm. Each small piece was immersed in one of the polishing compositions of Examples 1 to 12 and Comparative Example 1 at 25° C. for 5 minutes. The etching rate of gallium arsenide converted from the specific gravity (5.3 g/cm³) of gallium arsenide and the difference between the weights of the wafer small piece before and after immersion is shown in the column entitled "etching rate of GaAs" of Table 2.

TABLE 2

| | Number of molecules adsorbed per 1 μm² of colloidal silica | Water contact angle [degree] | Polishing rate of GaAs [Å/min] | Etching rate of GaAs [Å/min] |
| --- | --- | --- | --- | --- |
| Example 1 | 0 | 19.0 | 485 | 20 |
| Example 2 | 7425 | 52.2 | 569 | 133 |
| Example 3 | 7477 | 50.4 | 543 | 127 |
| Example 4 | 0 | 43.8 | 431 | 90 |
| Example 5 | 0 | 41.3 | 449 | 87 |
| Example 6 | 0 | 53.2 | 599 | 140 |
| Example 7 | 2532 | 49.8 | 560 | 131 |
| Example 8 | 15926 | 50.2 | 531 | 124 |
| Example 9 | 65756 | 50.8 | 522 | 122 |
| Example 10 | 27368 | 52.9 | 449 | 105 |
| Example 11 | 48426 | 53.7 | 513 | 88 |
| Example 12 | 0 | 31.0 | 458 | 29 |
| Comparative Example 1 | — | 56.6 | 697 | 163 |

TABLE 3

Polisher: one-side CMP polishing apparatus
Politex (trade name) manufactured by Rodel Incorporated
Polishing pressure: 100 g/cm²
Rotational speed of platen: 50 rpm
Feed rate of polishing composition: 100 mL/min As shown in Table 2, it was observed that in the case of Examples 1 to 11, in which the polishing composition contains a water-soluble polymer, the etching rate of gallium arsenide was decreased as compared with the case of Comparative Example 1, in which the polishing composition contains no water-soluble polymers. This result suggests that a water-soluble polymer is effective for suppressing the occurrence of a level difference caused by etching.

The invention claimed is:

1. A polishing system comprising:
   an object including a portion containing a group III-V compound material; and
   a polishing composition that polishes the group III-V compound material in the object, the polishing composition comprising abrasive grains, an oxidizing agent, and a water-soluble polymer, wherein the water-soluble polymer is an anionic surfactant represented by the chemical formula: R1- X1-Y1 in which
   R1 represents an alkyl group, an alkylphenyl group, or an alkenyl group, X1 represents a polyoxyethylene group, a polyoxypropylene group, or a poly(oxyethlene oxypropylene) group, and Y1 represents a $SO_3M1$ group or a $PO_3M1_2$ group in which M1 represents a counter ion;
   R1 represents an alkenyl group, X1 represents a polyoxyethylene group, a polyoxyproplene group, or a poly(oxyethylene oxypropylene) group, and Y1 represents a $SO_3M1$ group, a $SO_4M1$ group, a $CO_2M1$ group, a $PO_3M1_2$ group in which M1 represents a counter ion; or
   R1 represents an alkyl group, an alkylphenyl group, or an alkenyl group, X1 represents a poly(oxyethylene oxypropylene) group, and Y1 represents a $SO_3M1$ group, a $SO_4M1$ group, a $CO_2M1$ group, or a $PO_3M1_2$ group in which M1 represents a counter ion.

2. The polishing system according to claim 1, wherein
   the water-soluble polymer has a hydrophilic group, and
   the portion containing a group III-V compound material after the object is polished with the polishing composition has a water contact angle lower than that of the portion containing a group III-V compound material after the object is polished with another composition having the same makeup as the polishing composition except that the water-soluble polymer is not contained therein.

3. The polishing system according to claim 1, wherein the object further includes a portion containing a silicon material, the polishing composition polishes the group III-V compound material and the silicon material in the object.

4. A method for polishing, comprising:
   providing the polishing system according to claim 1; and
   using the polishing composition to polish the group III-V compound material in the object.

5. The method according to claim 4, wherein
   the water-soluble polymer has a hydrophilic group, and
   the portion containing a group III-V compound material after the object is polished with the polishing composition has a water contact angle lower than that of the portion containing a group III-V compound material after the object is polished with another composition having the same makeup as the polishing composition except that the water-soluble polymer is not contained therein.

6. A method for producing a substrate, comprising:
   providing the polishing system according to claim 1; and
   using the polishing composition to produce a substrate by polishing the group III-V compound material in the object.

7. The method according to claim 6, wherein
   the water-soluble polymer has a hydrophilic group, and
   the portion containing a group III-V compound material after the object is polished with the polishing composition has a water contact angle lower than that of the portion containing a group III-V compound material after the object is polished with another composition having the same makeup as the polishing composition except that the water-soluble polymer is not contained therein.

* * * * *